(12) United States Patent
Koch et al.

(10) Patent No.: US 7,437,696 B2
(45) Date of Patent: Oct. 14, 2008

(54) METHOD AND DEVICE FOR DETERMINING THE TIME RESPONSE OF A DIGITAL CIRCUIT

(75) Inventors: Klaus Koch, München (DE); Birgit Sanders, Haar (DE); Pierrick Pedron, Antibes (FR)

(73) Assignee: Infineon Technologies AG, Munich (DE)

( * ) Notice: Subject to any disclaimer, the term of this patent is extended or adjusted under 35 U.S.C. 154(b) by 314 days.

(21) Appl. No.: 11/238,624

(22) Filed: Sep. 29, 2005

(65) Prior Publication Data

US 2006/0066317 A1 Mar. 30, 2006

(30) Foreign Application Priority Data

Sep. 30, 2004 (DE) .................. 10 2004 047 703

(51) Int. Cl.
*G06F 17/50* (2006.01)
(52) U.S. Cl. .................. 716/6; 716/4; 716/5; 703/19
(58) Field of Classification Search .............. 716/4–6; 703/19

See application file for complete search history.

(56) References Cited

U.S. PATENT DOCUMENTS

| | | | | |
|---|---|---|---|---|
| 4,924,430 A | * | 5/1990 | Zasio et al. ................. | 716/6 |
| 5,095,454 A | * | 3/1992 | Huang ......................... | 703/19 |
| 5,548,526 A | | 8/1996 | Misheloff | |
| 5,636,372 A | * | 6/1997 | Hathaway et al. .......... | 713/500 |
| 6,086,619 A | * | 7/2000 | Hausman et al. ............ | 703/6 |
| 6,799,308 B2 | * | 9/2004 | You et al. ................... | 716/6 |
| 6,990,645 B2 | * | 1/2006 | Lichtensteiger et al. ..... | 716/6 |
| 7,043,709 B2 | * | 5/2006 | Levy ............................ | 716/6 |
| 7,111,261 B2 | * | 9/2006 | Jones .......................... | 716/6 |
| 7,117,466 B2 | * | 10/2006 | Kalafala et al. ............. | 716/6 |
| 2005/0066297 A1 | * | 3/2005 | Kalafala et al. ............. | 716/6 |

FOREIGN PATENT DOCUMENTS

DE 693 00 914 T2 7/1996

* cited by examiner

*Primary Examiner*—Jack Chiang
*Assistant Examiner*—Naum B Levin
(74) *Attorney, Agent, or Firm*—Brinks Hofer Gilson & Lione

(57) ABSTRACT

A method and a device determine a time response of a digital circuit. The time response is determined as a time difference between a data delay of a data path of the digital circuit, and a clock delay of a clock signal, which causes storage of a data item on the data path, taking into account a check. The check is determined dependent on a data slew of a signal on the data path and a clock slew of the clock signal in such a way that a positive time difference ensures the correct saving of the data item.

23 Claims, 2 Drawing Sheets

METHOD AND DEVICE FOR DETERMINING THE TIME RESPONSE OF A DIGITAL CIRCUIT

This application claims the benefit of priority to German Patent Application DE 10 2004 047 703.5, filed on Sep. 30, 2004, herein incorporated by reference in its entirety

FIELD OF THE INVENTION

The present invention relates to a method and a device for determining a time response of a digital circuit, in particular a microelectronic digital circuit.

BACKGROUND

In digital circuits, data is stored in sequential elements or storage cells. Flip flops and latches are commonly used as sequential elements, which store a data signal that they read from a data pin at a moment when a clock edge reaches the sequential element. In order to store the data signal reliably in the sequential element, the data signal is stable throughout a certain interval (setup time) and remains stable afterwards throughout another interval (hold time) before an active edge of the clock (or another form of a timing signal) reaches the sequential element.

The static delay time analysis (static timing analysis; STA) checks whether minimum time requirements relating to the hold time and the setup time are satisfied. These minimum time requirements depend on a slew of the data signal and the clock signal, the worst slew being considered in each case. These minimum requirements can also be described by a hold timing check and a setup timing check.

Here the slew of a signal corresponds to an interval that elapses until a value of the signal rises from a first specific signal value, which for example for a rising edge is 10% of the signal's maximum value, to a second specific signal value, which is greater than the first signal value and for example is 90% of the signal's maximum value. Instead of 10% and 90%, 40% and 60% are also often used for determining the slew.

If a time response of the storage cell is monotonic in relation to the data slew and the clock slew, i.e. its time response can be described by a bilinear function in relation to the data slew and the clock slew, it is sufficient in each case to consider the maximum and the minimum of the possible data and clock slews at a data and a clock input of the storage cell. In principle, any one of the four possible combinations from the minimum and maximum of the data and clock slews can yield the greatest hold timing check or setup check.

STA methods according to prior art make an assumption about which combinations they use for calculating the hold timing check or setup check. For example, Synopsis' Primetime® checks only the combination minimum data slew & minimum clock slew and the combination maximum data slew & maximum clock slew, the greatest value in each case giving the hold timing check or setup timing check calculated by Primetime. Conversely, Magma's Blastfusion® calculates the hold timing check from the combination of minimum data slew & maximum clock slew, and the setup timing check from the combination of maximum data slew & minimum clock slew. Both of these methods can generate values both too pessimistic and too optimistic in relation to the hold timing check or the setup timing check.

According to the determination of the hold timing check and setup timing check, the STA methods determine a delay of a data path and a delay of a clock path for each storage cell; this is described more precisely with the help of FIG. 1. The data path 13 is the path of the data signal, which occurs for example at a storage cell 1 on an output pin (or at a port of a microelectronic circuit). Conversely, the clock path 12 is the path of the clock, which e.g. can begin at a port, an output of a PLL or a virtual clock pin. A start of the data signal is triggered in the normal way by the clock signal. A path from an output point 14 of the clock to a clock input of the storage cell 1, at which the data path 13 begins, is denoted as data clock path 11. Conversely, a path from the output point 14 of the clock to a clock input of a storage cell 2, at which the data path 13 ends, is denoted as receive clock path 12. A combination of a particular data clock path, data path and receive clock path is called a path. It should be noted here that in real circuits, which are more complicated than the circuit specified in FIG. 1, there are usually several data paths, data clock paths and receive clock paths for each storage cell. That is, in a real circuit there are generally several data paths, which lead from the data output of the storage cell 1 or other storage cells or input ports (which are not shown in FIG. 1) to the data input of the storage cell 2.

To determine a time response for a digital circuit, a hold time difference or a hold time skew and a setup time difference or a setup time skew are calculated according to the following formulae (1), (2):

$$\text{Hold time difference} = \text{Data delay} - \text{Clock delay} - \text{Hold time check} \quad (1)$$

$$\text{Setup time difference} = \text{Clock delay} - \text{Data delay} - \text{Setup timing check} \quad (2)$$

The data delay in equation (1) is the minimum delay of all possible data paths for the particular storage cell, and the clock delay is the maximum delay of all possible receive clock paths for the particular storage cell. Conversely, in equation (2) the clock delay is the minimum delay of all possible receive clock paths for the particular storage cell, and the data delay is the maximum delay of all possible data clock paths for the particular storage cell.

In the calculation of the check, the data and clock slews are used, which are propagated in each case over all possible corresponding data paths, data clock paths and receive clock paths up to the data and clock input. In relation to the selection of which slews (caused by different timing arcs) should be propagated by the cells and crosspoints, various methods already known in prior art can be applied.

The hold time difference and setup time difference calculated with the equations (1) and (2) can be positive or negative. A negative hold time difference or setup time difference means that a hold time condition or setup time condition has been violated, i.e. it cannot be guaranteed that the corresponding data signal will be reliably saved in the corresponding storage cell. A difference of 0 sec means no violation yet of the hold time difference or the setup time difference, but it is probable that such a violation then occurs in a real circuit (in silicon).

In order for the determination of the time response for a digital circuit to return a correct result, both the hold timing check and the setup timing check must be correctly determined. This is not achieved by methods according to prior art, as previously explained, and consequently the methods according to prior art do not return a correct result for the time response of a digital circuit, or at least not always.

BRIEF SUMMARY

By way of introduction only, a method for determining the time response of a digital circuit that provides a correct result for the time response is presented. The time response is dependent on a data delay of a data path of the digital circuit and on a clock delay of a clock signal, which causes storage of a data item on the data path. The method includes determining the time response as a time difference between the data delay and the clock delay taking into account a check, and determining the check dependent on a data slew of a signal on the data path and a clock slew of the clock signal such that a positive time difference ensures the correct saving of the data item. A computer program product with a computer program is also presented, which when run in a computer system executes the above method.

A device for determining a time response of a digital circuit is also presented. The device determines the time response dependent on a data delay of a data path of the digital circuit and on a clock delay of a clock signal, which causes storage of a data item on the data path. The device determines the time response as a time difference between the data delay and the clock delay taking into account a check, and determines the check dependent on a data slew of a signal on the data path and a clock slew of the clock signal, such that a positive time difference ensures the correct saving of the data item.

The foregoing summary has been provided only by way of introduction. Nothing in this section should be taken as a limitation on the following claims, which define the scope of the invention.

BRIEF DESCRIPTION OF THE DRAWINGS

The present invention will be further described with reference to the included drawings.

DETAILED DESCRIPTION OF THE PREFERRED EMBODIMENTS

Figure 1:
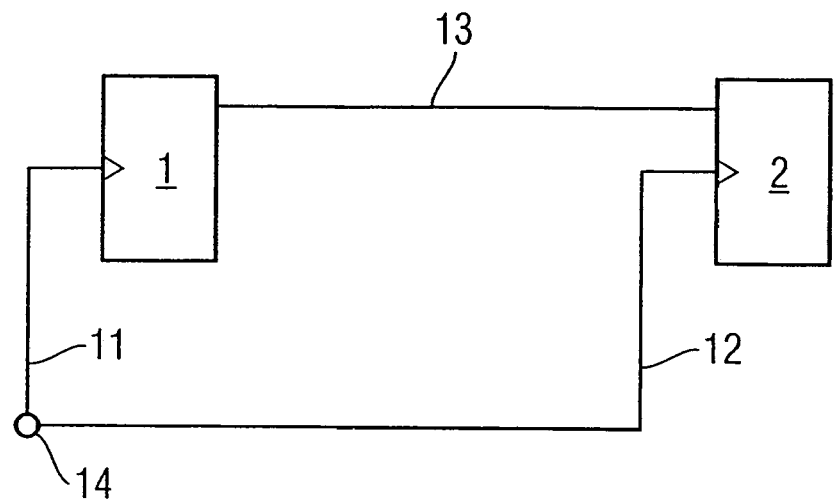
In FIG. 1, a digital circuit to illustrate the method according to the invention is shown.

A method for determining a time response of a digital circuit is provided. The time response is determined by means of a time difference dependent on a data delay of a data path of the digital circuit, a clock delay of a clock signal, which causes storage of a data item on the data path, and a check. The check, in turn, is determined dependent on a data slew of a signal on the data path and a clock slew of the clock signal such that a positive time difference always ensures the correct saving of the data item.

The check is correctly calculated in every case as the check is determined dependent on the data slew and the clock slew, and not dependent on extreme values of the data slew or clock slew. In particular, this is also the case when the check is not a bilinear function of the data slew and the clock slew, or when the check is not monotonic in relation to the data slew and the clock slew.

Especially when the time difference is a hold time difference and the check is a hold timing check, the time difference can be determined from a difference between the data delay and a sum of the clock delay and the time check (see also equation (1)). Here the hold timing check in particular is the maximum of a hold time function, which is dependent on the data slew and the clock slew.

Methods that determine the hold timing check dependent only on extreme values of the data slew and the clock slew, do not correctly determine the maximum of the hold time function and hence the hold timing check, if the maximum of the hold time function is not present for the extreme values of the data slew and the clock slew. Conversely, the method described herein also determines the hold timing check correctly when the maximum of the hold time function is not present for a minimum or maximum of the data slew or clock slew, but for example at an average data slew and an average clock slew.

The hold timing check is determined by determining the hold time function at four points only and setting the hold timing check equal to the maximum value of the hold time function at these four points. These four points are formed in each case by the extreme values of the data slew and the clock slew. This is useful when the hold time function is a previously recorded bilinear function.

Since the time check is determined by calculating the function at four points only, it can calculate this time check faster than if it had to search for the maximum of the hold time function at additional points too, or than if it had to search a total area spanned by the four points for the maximum of the function.

Whether the hold time function is bilinear can be checked by determining the hold time function for different points or value pairs of the data slew and the clock slew, and then checking whether the corresponding values of the hold time function remain monotonic at these points with regard to a change of the data slew or clock slew.

The hold timing check is determined in that hold time function values are determined for different value pairs consisting of the data slew and the clock slew, either the maximum of these hold time function values or a mean value (geometric or arithmetic mean) of these hold time function values then forming the hold timing check. These value pairs can be chosen such that they evenly cover (i.e. at similar distances) the area spanned by the extreme values of the data slew and the clock slew.

The determination of the maximum of hold time function values that belong to value pairs, which are distributed over the area spanned by the extreme values of the data slew and the clock slew, corresponds to a sampling of the spanned area. Increments between these samplings can be chosen to be equal or different for each axis. This embodiment is very time consuming (in the CPU time of a computer system on which the method is running), but guarantees exact results for a hold time function that is not monotonic. The maximum can be determined by known optimization methods. However, for this the values needed for the method, or to be investigated, are determined according to the invention.

Since both a value for the data slew and also a value for the clock slew is dependent on events, such as e.g. interference by an adjacent line, the interference depending for example on an electric current or a clock frequency on the adjacent line, the individual function values can be weighted when averaging, according to a probability of occurrence of the associated value pair. This causes the average value and hence the hold timing check to depend more on hold time function values that belong to a data slew and clock slew that occur more frequently or with greater probability.

The time difference can also be a setup time difference and the check a setup timing check. The setup time difference is determined in particular here from a difference between the clock delay and a sum of the data delay and the setup timing check (see also equation (2)). This setup timing check is in particular the maximum of a setup time function, which is dependent on the data slew and the clock slew.

A check can also be determined for a modified digital circuit. For this, in a first step, the check is determined using the method described above, for the digital circuit which is to be modified. Then, in a second step, a further check is determined for the digital circuit by a method according to prior art, and a correction value is determined from a difference between the check and the further check. When the digital circuit is modified, a further check is calculated for the modified digital circuit by the method according to prior art. The check for the modified digital circuit is then determined from the further check calculated by the method according to prior art for the modified digital circuit, and the correction value.

Since a difference between the check calculated by the method according to the invention and a check determined by a method according to prior art usually remains constant even after changes to the digital circuit (or at most is reduced), the check for the modified digital circuit can also be calculated by a method according to prior art, in order to obtain a correct result, if the check calculated by the method according to prior art is subsequently corrected using the correction value.

A device for determining a time response of a digital circuit is also provided. The device is developed such that it determines the time response by means of a time difference dependent on a data delay of a data path of the digital circuit, a clock delay of a clock signal, which causes storage of a data item on the data path, and a check. The device determines the check in turn dependent on a data slew of a signal on the data path and a clock slew of the clock signal in such a way that a positive time difference always ensures the correct saving of the data item.

Further embodiments of the device are developed to execute the previously described method. In relation to a further description of the device, reference is therefore made to the corresponding previously described sections, which describe the method according to the invention. A data medium or a computer program product with a computer program is also provided, the method according to the invention being executed in an execution of the computer program in a computer system.

Figure 2:
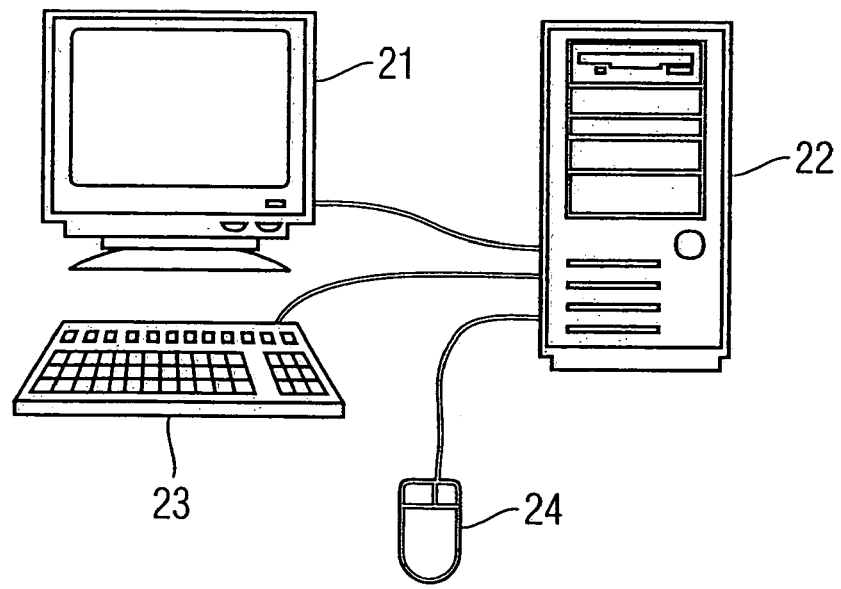
FIG. 2 shows a computer system, on which the method according to the invention runs.

Turning to the figures, FIG. 1 was already described previously, so the description is not repeated here. FIG. 2 shows a computer system, which as well as a keyboard 23, a monitor 21 and a mouse 24 also has a computer 22, which contains a main memory, a hard disk, exchangeable storage media and a microprocessor. For determining a time response of a digital circuit, necessary information and descriptions from a circuit layout of the digital circuit are first stored in the storage media, along with a computer program provided to execute the method according to the invention, by e.g. inputting them into the computer system using the mouse and keyboard, or notifying the computer system of them using an exchangeable storage medium. This computer system then executes the previously described method to determine a time response of a digital circuit, under automatic software control by access to the information and descriptions stored in the computer system's storage media. The invention can of course also be used in a computer network (not shown) consisting of several computers.

Figure 3:
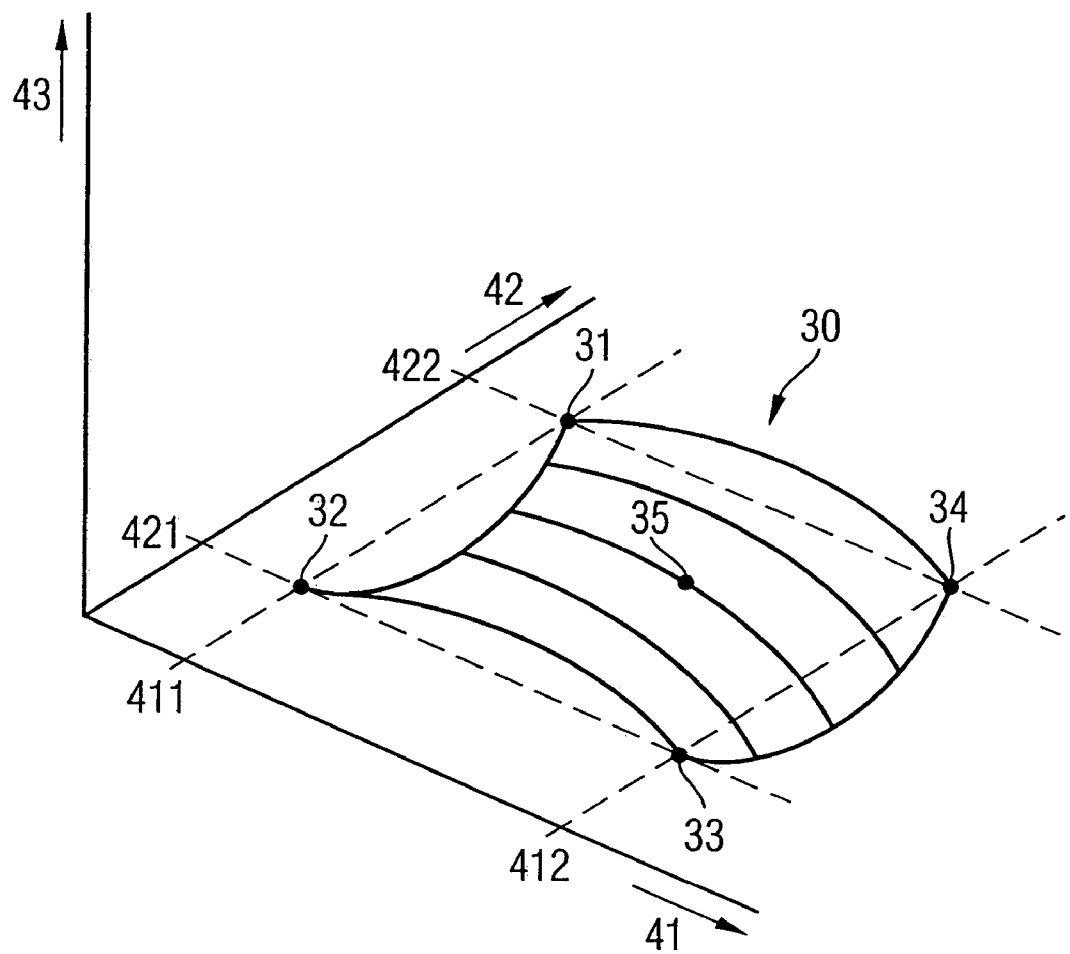
FIG. 3 shows an example of a hold time function dependent on the data slew and the clock slew.

FIG. 3 shows an example of a hold time function 43 dependent on the data slew 41 and the clock slew 42. Here, a point marked with a reference label 31 represents the coordinates of the minimum data edge slope 411, the maximum clock slew 422 and an associated function value.

Similarly, a point marked with a reference label 33 represents the coordinates of the maximum data slew 412, the minimum clock edge slope 421 and an associated function value. The four points marked with reference labels 31 34 thus represent four value pairs of the data slew 41 and the clock slew 42 and an associated hold time function value 43 in each case, the four value pairs being formed in each case by different extreme values (minimum or maximum) of the data slew 41 and the clock slew 43. An area 30 spanned by these four points must be searched for a maximum of the hold time function in the case of a non-bilinear hold time function 43.

A point marked with a reference label 35 identifies the maximum of the function value 43, neither the data slew 41 nor the clock slew 42 having an extreme value at this maximum.

The above method and device is suitable for correctly estimating a time response of microelectronic digital circuits. However, it is not restricted to this application, but rather can also be used, for example, in digital circuits that are not of microelectronic construction.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for determining a time response of a digital circuit, the time response dependent on a data delay of a data path of the digital circuit and on a clock delay of a clock signal, which causes storage of a data item on the data path, the method comprising determining the time response as a time difference between the data delay and the clock delay taking into account a check, and determining the check dependent on a data slew of a signal on the data path and a clock slew of the clock signal such that a positive time difference ensures the correct saving of the data item; and wherein the time difference is a hold time difference and the check is a hold timing check, the hold time difference being determined from a difference between the data delay and a sum of the clock delay and the hold timing check, the hold timing check being a maximum of a hold time function, which is dependent on the data slew and the clock slew.

2. The method according to claim 1, wherein the maximum of the hold time function is determined by determining a maximum of a first hold time function value, which is dependent on a minimum data slew and a minimum clock slew, of a second hold time function value, which is dependent on the minimum data slew and a maximum clock slew, of a third hold time function value, which is dependent on a maximum data slew and the minimum clock slew, and of a fourth hold time function value, which is dependent on the maximum data slew and the maximum clock slew.

3. The method according to claim 2, wherein the maximum of the hold time function is only determined with the help of the first, second, third and fourth hold time function value when it is recorded that the hold time function is bilinear dependent on the data slew and the clock slew.

4. The method according to claim 3, wherein it is recorded that the hold time function is bilinear dependent on the data slew and the clock slew, if for different value pairs of the data slew and the clock slew it is recorded that the hold time function is monotonic with regard to a change of the data slew or clock slew.

5. The method according to claim 1, wherein the hold timing check is determined by forming a maximum from several hold time function values, the several hold time function values dependent on several value pairs of the data slew and the clock slew.

6. The method according to claim 5, wherein the several value pairs describe points on an area which is spanned by a respective minimum and maximum of the data slew and the clock slew, which cover the area.

7. The method according to claim 1, wherein the hold timing check is formed from an average value of several hold time function values, the several hold time function values dependent on several value pairs of the data slew and the clock slew.

8. The method according to claim 7, wherein in averaging, the hold time function value of a value pair is weighted dependent on a probability of occurrence of the value pair.

9. A method for determining a time response of a digital circuit, the time response dependent on a data delay of a data path of the digital circuit and on a clock delay of a clock signal, which causes storage of a data item on the data path, the method comprising determining the time response as a time difference between the data delay and the clock delay taking into account a check, and determining the check dependent on a data slew of a signal on the data path and a clock slew of the clock signal such that a positive time difference ensures the correct saving of the data item; and wherein the time difference is a setup time difference and the check is a setup timing check, the setup time difference being determined from a difference between the clock delay and a sum of the data delay and the setup timing check, the setup timing check being a maximum of a setup time function, which is dependent on the data slew and the clock slew.

10. The method according to claim 9, wherein the maximum of the setup time function is determined by determining a maximum of a first setup time function value, which is dependent on a minimum data slew and a minimum clock slew, of a second setup time function value, which is dependent on the minimum data slew and a maximum clock slew, of a third setup time function value, which is dependent on a maximum data slew and the minimum clock slew, and of a fourth setup time function value, which is dependent on the maximum data slew and the maximum clock slew.

11. The method according to claim 10, wherein the maximum of the setup time function is only determined with the help of the first, second, third and fourth setup time function value when it is recorded that the setup time function is bilinear dependent on the data slew and the clock slew.

12. The method according to claim 11, wherein it is recorded that the setup time function is bilinear dependent on the data slew and the clock slew, if for different value pairs of the data slew and the clock slew it is recorded that the setup time function is monotonic with regard to a change of the data slew or clock slew.

13. The method according to claim 9, wherein the setup timing check is determined by forming a maximum from several setup time function values, the several setup time function values dependent on several value pairs of the data slew and the clock slew.

14. The method according to claim 13, wherein the several value pairs describe points on an area which is spanned by a respective minimum and maximum of the data slew and the clock slew, which evenly cover the area.

15. The method according to claims 9, wherein the setup timing check is formed from an average value of several setup time function values, the several setup time function values dependent on several value pairs of the data slew and the clock slew.

16. The method according to claim 15, wherein in averaging, the setup time function value of a value pair is weighted dependent on a probability of occurrence of the value pair.

17. A method for determining a time response of a digital circuit, the time response dependent on a data delay of a data path of the digital circuit and on a clock delay of a clock signal, which causes storage of a data item on the data path, the method comprising determining the time response as a time difference between the data delay and the clock delay taking into account a check, and determining the check dependent on a data slew of a signal on the data path and a clock slew of the clock signal such that a positive time difference ensures the correct saving of the data item; and wherein a new check for a modified digital circuit, which has resulted from the digital circuit because of a change, is determined in that the new check is determined from a correction value and a further check, which is determined by a further method, the correction value being calculated from a difference between the check determined for the digital circuit, and the further check for the digital circuit determined by the further method.

18. A device for determining a time response of a digital circuit, the device is configured to determine the time response dependent on a data delay of a data path of the digital circuit and on a clock delay of a clock signal, which causes storage of a data item on the data path, wherein the device is further configured to determine the time response as a time difference between the data delay and the clock delay taking into account a check, and determines the check dependent on a data slew of a signal on the data path and a clock slew of the clock signal, such that a positive time difference ensures the correct saving of the data; and wherein the time difference is a hold time difference and the check is a hold timing check, the hold time difference being determined from a difference between the data delay and a sum of the clock delay and the hold timing check, the hold timing check being a maximum of a hold time function, which is dependent on the data slew and the clock slew.

19. A computer readable medium storing a computer program having executable code, the executable code configures a computer system to perform a method of determining a time response of a digital circuit, the time response dependent on a data delay of a data path of the digital circuit and on a clock delay of a clock signal, which causes storage of a data item on the data path, the method comprising determining the time response as a time difference between the data delay and the clock delay taking into account a check, and determining the check dependent on a data slew of a signal on the data path and a clock slew of the clock signal such that a positive time difference ensures the correct saving of the data; and wherein the time difference is a hold time difference and the check is a hold timing check, the hold time difference being determined from a difference between the data delay and a sum of the clock delay and the hold timing check, the hold timing check being a maximum of a hold time function, which is dependent on the data slew and the clock slew.

20. A device for determining a time response of a digital circuit, the device is configured to determine the time response dependent on a data delay of a data path of the digital circuit and on a clock delay of a clock signal, which causes storage of a data item on the data path, wherein the device is further configured to determine the time response as a time difference between the data delay and the clock delay taking into account a check, and determines the check dependent on a data slew of a signal on the data path and a clock slew of the clock signal, such that a positive time difference ensures the correct saving of the data item; and wherein the time difference is a setup time difference and the check is a setup timing check, the setup time difference being determined from a difference between the clock delay and a sum of the data delay and the setup timing check, the setup timing check being a maximum of a setup time function, which is dependent on the data slew and the clock slew.

21. A computer readable medium storing a computer program having executable code, the executable code configures a computer system to perform a method of determining a time response of a digital circuit, the time response dependent on a data delay of a data path of the digital circuit and on a clock delay of a clock signal, which causes storage of a data item on the data path, the method comprising determining the time response as a time difference between the data delay and the clock delay taking into account a check, and determining the check dependent on a data slew of a signal on the data path and a clock slew of the clock signal such that a positive time difference ensures the correct saving of the data item; and wherein the time difference is a setup time difference and the check is a setup timing check, the setup time difference being determined from a difference between the clock delay and a sum of the data delay and the setup timing check, the setup timing check being a maximum of a setup time function, which is dependent on the data slew and the clock slew.

22. A device for determining a time response of a digital circuit, the device is configured to determine the time response dependent on a data delay of a data path of the digital circuit and on a clock delay of a clock signal, which causes storage of a data item on the data path, wherein the device is further configured to determine the time response as a time difference between the data delay and the clock delay taking into account a check, and determines the check dependent on a data slew of a signal on the data path and a clock slew of the clock signal, such that a positive time difference ensures the correct saving of the data item; and wherein a new check for a modified digital circuit, which has resulted from the digital circuit because of a change, is determined in that the new check is determined from a correction value and a further check, which is determined by a further method, the correction value being calculated from a difference between the check determined for the digital circuit, and the further check for the digital circuit determined by the further method.

23. A computer readable medium storing a computer program having executable code, the executable code configures a computer system to perform a method of determining a time response of a digital circuit, the time response dependent on a data delay of a data path of the digital circuit and on a clock delay of a clock signal, which causes storage of a data item on the data path, the method comprising determining the time response as a time difference between the data delay and the clock delay taking into account a check, and determining the check dependent on a data slew of a signal on the data path and a clock slew of the clock signal such that a positive time difference ensures the correct saving of the data item; and wherein a new check for a modified digital circuit, which has resulted from the digital circuit because of a change, is determined in that the new check is determined from a correction value and a further check, which is determined by a further method, the correction value being calculated from a difference between the check determined for the digital circuit, and the further check for the digital circuit determined by the further method.

* * * * *

UNITED STATES PATENT AND TRADEMARK OFFICE
CERTIFICATE OF CORRECTION

PATENT NO. : 7,437,696 B2
APPLICATION NO. : 11/238624
DATED : October 14, 2008
INVENTOR(S) : Klaus Koch et al.

It is certified that error appears in the above-identified patent and that said Letters Patent is hereby corrected as shown below:

In column 7, in claim 15, line 1, after "according to" delete "claims" and substitute --claim-- in its place.

In column 8, in claim 18, line 11, after "saving of the" delete "data;" and substitute --data item;-- in its place.

In column 8, in claim 19, line 12, after "saving of the" delete "data;" and substitute --data item;-- in its place.

Signed and Sealed this

Tenth Day of March, 2009

JOHN DOLL
*Acting Director of the United States Patent and Trademark Office*